United States Patent [19]

Fukuhara et al.

[11] 4,274,035
[45] Jun. 16, 1981

[54] FIELD EMISSION ELECTRON GUN

[75] Inventors: Satoru Fukuhara, Kokubunji; Hideo Todokoro, Tokyo; Yoshio Sakitani, Saitama, all of Japan

[73] Assignee: Hitachi, Ltd., Tokyo, Japan

[21] Appl. No.: 56,527

[22] Filed: Jul. 11, 1979

[30] Foreign Application Priority Data

Jul. 21, 1978 [JP] Japan .................................. 53-88407

[51] Int. Cl.³ ............................................. G21K 7/00
[52] U.S. Cl. .................................... 315/357; 315/107; 315/291; 250/311; 250/398
[58] Field of Search ................. 315/357, 350, 291, 94, 315/107; 250/396 R, 398, 311; 313/336, 346, 347

[56] References Cited

U.S. PATENT DOCUMENTS 3,292,041  12/1966  Katagiri et al. ...................... 315/357

FOREIGN PATENT DOCUMENTS 52-4772  1/1977  Japan .................................. 250/396 R Primary Examiner—Alfred E. Smith
Assistant Examiner—Thomas P. O'Hare
Attorney, Agent, or Firm—Craig and Antonelli

[57] ABSTRACT

A field emission electron gun including a cathode, a control electrode which is disposed in the vicinity of the cathode, an anode which is disposed for accelerating electrons emitted from the cathode, and a source of a D.C. voltage to be applied between the cathode and the anode. Also, there is provided a switching arrangement capable of changing-over a potential of the control electrode between ground potential and a potential of the cathode, and an arrangement capable of varying relative positions of the cathode and the control electrode.

9 Claims, 3 Drawing Figures

FIELD EMISSION ELECTRON GUN

BACKGROUND OF THE INVENTION

The present invention relates to an electron gun for a system wherein electrons are emitted from a cathode or emitter by an electric field in an electron microscope or the like.

The field emission electron gun is based on a method in which a high electric field (of, for example, $10^7$ V/cm) is applied to a pointed cathode (having a radius of curvature of, for example, 1,000 Å or 100 nm), thereby to emit electrons owing to the tunnel effect. It makes it possible to fabricate an electron microscope which has a much higher brightness and smaller electron source than with the conventional thermal electron emission and which exhibits a high resolving power.

In case of utilizing the field emission electron gun for the electron microscope, it is desired to properly use two levels of energies of low energy (for example, approximately 5 kV) and high energy (for example, approximately 10 kV or above) as the energies of an electron beam to impinge on a sample. This is because the low energy brings forth the advantages of preventing the charge-up of the sample, permitting the observation of a very shallow surface portion of the sample, etc., while the high energy can reduce astigmation and makes it possible to realize an electron microscope of high resolving power.

With the field emission electron gun, however, the emission electron current is proportional to the applied electric field, so that the high energy (for example, approximately 10 kV or above) results in increasing the emission electron current and in shortening the lifetime of the cathode.

In order to avoid this drawback, an electrode of the Butler type has heretofore been employed. FIG. 1 is a view for explaining a field emission electron gun which employs the Butler type electrode. A drawing-out voltage $V_A$ (for example, approximately 5 kV) is applied between a cathode 1 and a first anode 2 by a D.C. power supply 3, to cause the electron emission from the cathode 1. Emitted electrons 9 are accelerated into an electron beam of high energy (for example, 15 kV) by a second anode 5 to which an accelerating voltage $V_B$ is applied by a D.C. power supply 4. The electron beam is focused and projected on a sample 7 by an electromagnetic lens 6. In the figure, numeral 8 designates a vacuum vessel.

This method has the disadvantage that since the first anode 2 and the second anode 5 have the lens action, they form a cause for astigmatism, and such disadvantage in handling that the centering, in the case of the change-over between the high energy and low energy is difficult. Besides, with this method, the structure becomes complicated, and two high-voltage sources are required.

SUMMARY OF THE INVENTION

The present invention has as an object the overcoming of the above drawbacks of the prior art by providing a field emission electron gun comprising means capable of simply changing-over electron beams of low energy and high energy while maintaining an emission electron current constant.

In accordance with the present invention, a field emission electron gun is provided comprising a cathode, a control electrode which is disposed in the vicinity of the cathode, an anode which is disposed for accelerating an electron current emitted from the cathode, a source of a D.C. voltage to be applied between the cathode and the anode, switching means which is disposed in a manner to be capable of switching a potential of the control electrode between ground potential and a potential of the cathode, and means capable of changing relative positions of the cathode and the control electrode.

These and further objects, features and advantages of the present invention will become more obvious from the following description when taken in connection with the accompanying drawings, wherein

DETAILED DESCRIPTION OF THE PREFERRED EMBODIMENT

Figure 1:
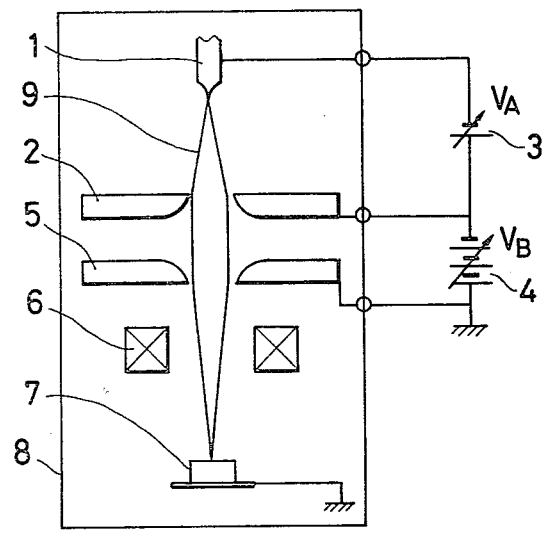
FIG. 1 is a view for explaining a prior-art field emission electron gun.
Figure 2:
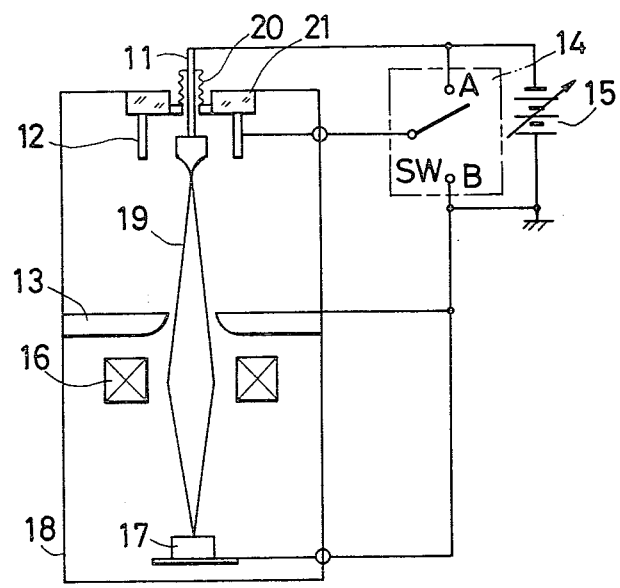
FIG. 2 is a view for explaining an embodiment of this invention.

FIG. 2 is a view for explaining one embodiment of a field emission electron gun according to this invention. As shown in the figure, a control electrode 12 is disposed in the vicinity of a cathode 11. Electrons emitted from the cathode 11 are focused into a beam 19 by an electron optics lens 16 through an anode 13 and is projected on a sample 17. All the components are installed in a vacuum vessel 18. The cathode 11 and the control electrode 12 are insulated by an insulator 21, and they are respectively led into an insulating transformer by high-tension cables. A D.C. power supply 15 and a switch 14 are installed inside the insulated transformer. By the change-over of the switch 14, the control electrode 12 can be connected with either ground potential at position B or the same potential as that of the cathode 11 at position A.

When the control electrode 12 is connected with ground potential, the energy of the electron beam to be emitted from the cathode 11 is equal to a drawing-out voltage applied by the D.C. power supply 15 (for example, about 5 kV) and becomes low energy. When the control electrode 12 is connected with the same potential as that of the cathode 11, an electric field at the tip of the cathode is concealed by the control electrode 12, and no field emission occurs. In order to cause the field emission, the voltage of the D.C. power supply 15 is increased. The energy of the electron beam to be emitted at that time becomes high energy (for example, about 10 kV or above). In this manner, even when the high supply voltage is increased, the energy of the electron current can be made high without the emission of any high current.

Figure 3:
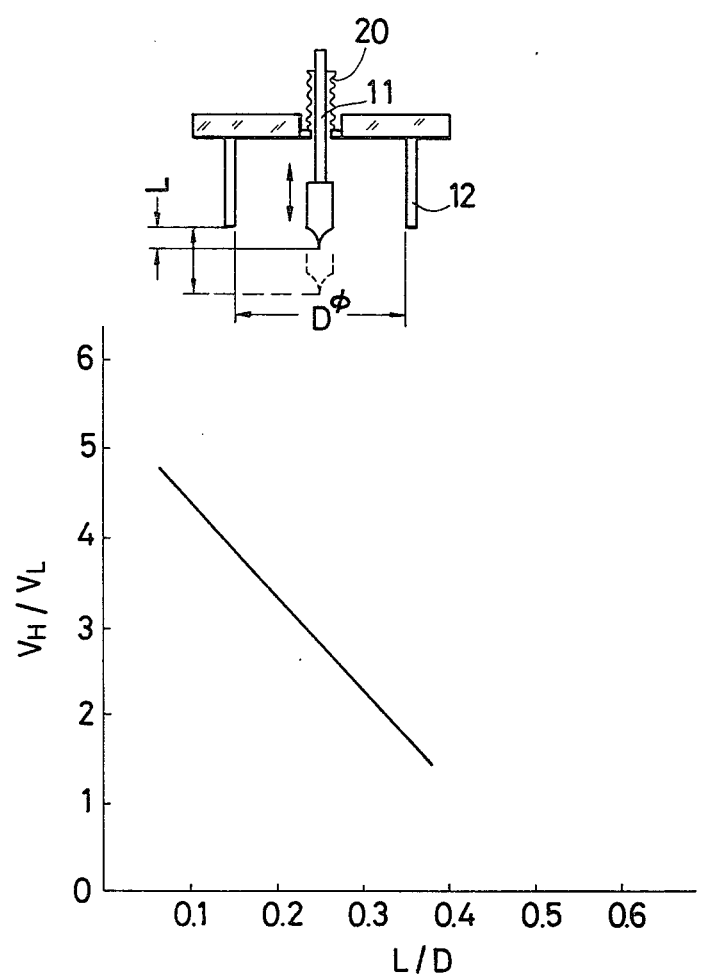
FIG. 3 is a diagram showing an example of a characteristic of the embodiment.

The magnitude of the high energy can be determined as desired, depending upon the mutual positions or shapes of the cathode 11 and the control electrode 12. More specifically, by vertically moving a device which supports the cathode 11, for example, bellows 20, it is possible to vary the mutual positions of the cathode 11 and the control electrode 12 and to change the value of the high energy as desired. FIG. 3 illustrates the ratio between the high energy and the low energy at the time when the inside diameter (D) of the cylindrical control electrode 12 and the position (L) of the cathode 11 relative to the control electrode 12 are varied. In the figure, the abcissa indicates the ratio of L/D, while the ordinate indicates the ratio of $V_H/V_L$. Here, $V_L$ denotes a voltage in the case where an emission current of, for example, approximately 10 μA is emitted when the control electrode is made the ground potential. $V_H$ denotes a voltage in the case where the emission current of, for example, approximately 10 μA is emitted when the control electrode is made the same potential as that of the cathode. As understood from the diagram, by externally changing the position of the control electrode 12, with respect to the cathode, it is possible to obtain an electron beam of any desired energy (in this embodiment, above approximately 5 kV).

Needless to say, this invention is not restricted to the various numerical values and shapes employed in the above description of the embodiment, but appropriate values and shapes can be selected depending upon set conditions. Although, in the foregoing embodiment, the length L is varied by making the cathode movable relative to the control electrode, it is also possible to vary the length L by making the control electrode movable relative to the cathode.

As set forth above, according to this invention, the position of the cathode or that of the control electrode is made variable externally of the vacuum, thereby making it possible to obtain the electron beam of any desired high energy. It is possible to change-over the electron beams of low energy and high energy with the very simple construction consisting of the single switch and the single high-voltage source, and the handling is also simple which is very advantageous. Further, with this invention, which can vary the irradiation energy of the electron beam most simply, an electron microscope of high resolving power can be fabricated.

It is understood that the present invention is not limited to the details shown and described herein but is susceptible to numerous changes and modifications as known to those skilled in the art such that the present invention is intended to cover all such changes and modifications as are encompassed by the scope of the appended claims.

We claim:

1. A field emission electron gun comprising a cathode, a control electrode disposed in the vicinity of said cathode, and anode disposed along a beam path extending from said cathode for accelerating electrons emitted from said cathode, a variable D.C. voltage source connected between said cathode and said anode, switch means connected between said voltage source and said control electrode for changing-over the potential of said control electrode between ground potential and the potential of said cathode, and means for varying the position of said cathode relative to said control electrode said anode being fixed in position relative to one of said cathode and said control electrode at a position downstream of said control electrode along said beam path.

2. A field emission electron gun according to claim 1, wherein said means for varying comprises means for moving said cathode whereby the relative positions of said cathode and said control electrode are variable.

3. A field emission electron gun according to claim 1, wherein said means for varying comprises means for moving said control electrode whereby the relative positions of said cathode and said control electrode are variable.

4. A field emission electron gun according to claim 1, wherein said control electrode has a cylindrical shape, and said cathode is arranged in a central part of the cylindrical control electrode.

5. A field emission electron gun according to claim 1, 2, 3, or 4, wherein the D.C. voltage source comprises a single variable high-voltage source.

6. A field emission electron gun according to claim 1, further comprising a vacuum vessel containing said cathode, said control electrode and said anode, said D.C. voltage source, said switching means and said means for varying being arranged exteriorly of said vacuum vessel.

7. A field emission electron gun according to claim 1, wherein said means for varying includes a vertical moving means for supporting at least one of said cathode and said control electrode for enabling varying of the relative positions thereof.

8. A field emission electron gun according to claim 7, wherein the vertical moving means includes a bellows.

9. A field emission electron gun comprising a cathode, a control electrode disposed in the vicinity of said cathode, an anode disposed along a beam path extending from said cathode for accelerating a beam of electrons emitted from said cathode, a D.C. voltage source connected between said cathode and said anode, and switch means connected between said voltage source and said control electrode for changing-over the potential of said control electrode between ground potential and the potential of said cathode, said voltage source being variable between a low energy voltage level while said control electrode is connected to ground potential and a high energy voltage level when said control electrode is connected to the same potential as said cathode such that the energy of said beam of electrons can be changed from a low level to a high level without significant increase in the beam current.

* * * * *